United States Patent [19]

Errichiello

[11] Patent Number: 5,421,082
[45] Date of Patent: Jun. 6, 1995

[54] METHOD OF FORMING A DECAL HAVING CONDUCTIVE PATHS THEREON

[75] Inventor: Dominic R. Errichiello, Roselle, Ill.

[73] Assignee: Motorola, Inc., Schaumburg, Ill.

[21] Appl. No.: 125,367

[22] Filed: Sep. 22, 1993

[51] Int. Cl.$^6$ ............................................... H05K 3/02
[52] U.S. Cl. ..................................................... 29/846
[58] Field of Search ................................. 29/846, 825; 264/272.17; 427/96; 156/630, 631, 249

[56] References Cited

U.S. PATENT DOCUMENTS

| | | | |
|---|---|---|---|
| 3,024,151 | 3/1962 | Robinson | 29/846 X |
| 3,085,295 | 4/1963 | Pizzino et al. | 29/846 X |
| 3,301,730 | 1/1967 | Spiwak et al. | 20/846 X |
| 3,350,250 | 10/1967 | Sanz et al. | 29/846 X |
| 4,424,408 | 1/1984 | Elarde | |
| 4,532,152 | 7/1985 | Elarde | |
| 4,694,572 | 9/1987 | Leber et al. | 29/846 X |
| 4,870,751 | 10/1989 | Antoon | 29/846 |
| 5,013,397 | 5/1991 | Tsukakoshi | 29/846 |

Primary Examiner—Carl J. Arbes
Attorney, Agent, or Firm—Steven G. Parmelee

[57] ABSTRACT

A decal (51) having a conductive pattern is first fabricated. This fabrication includes plating a layer of a conductive material (22) using a thermal spraying method. After completing the fabrication of the decal (51) having the conductive pattern, the decal (51) is then affixed to a component (81). In one embodiment, heat and pressure is used to bond the decal (51) to the component (81). In an alternative embodiment, the decal (51) is placed in a mold (61) from which the component (81) is to be molded. Resin (71), forming the component (81), is then placed into the mold (61). After molding, a device comprising the component (81) with the conductive pattern is thus formed. The result of both embodiments is a device with a conductive pattern affixed on at least one of the device's surfaces.

25 Claims, 3 Drawing Sheets

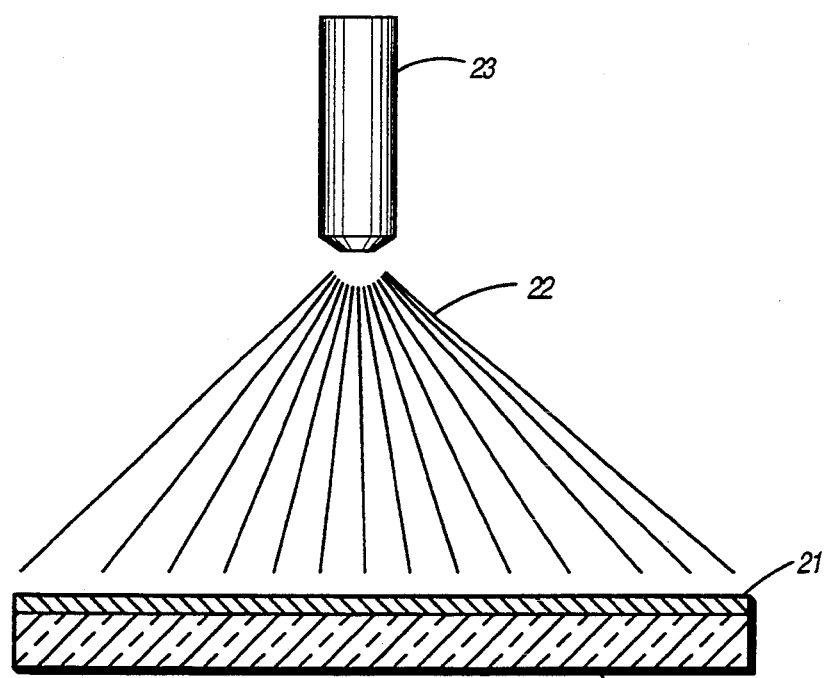
FIG.1
FIG.2
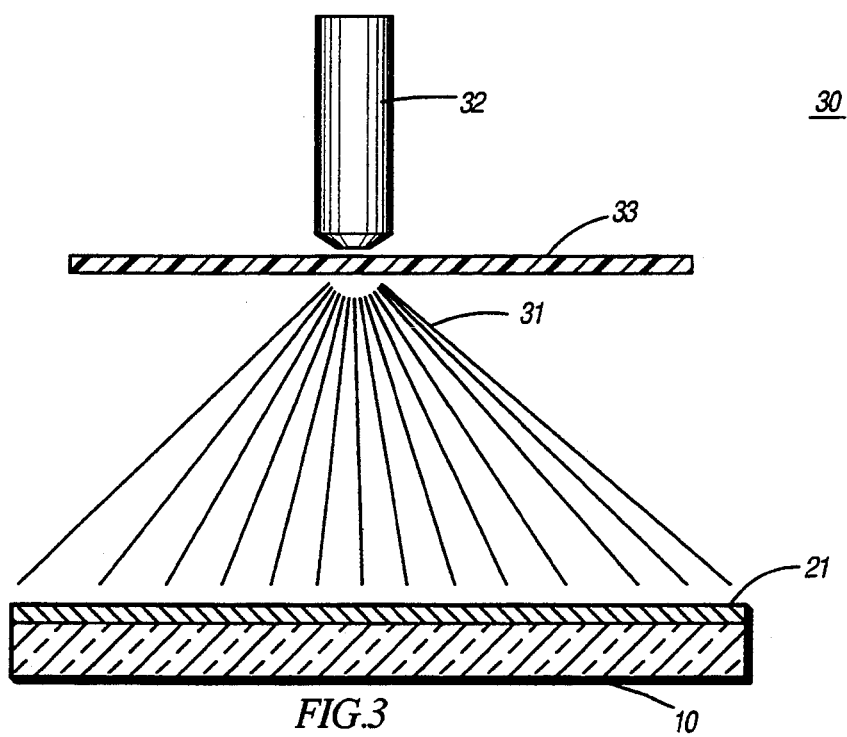
FIG.3

METHOD OF FORMING A DECAL HAVING CONDUCTIVE PATHS THEREON

FIELD OF THE INVENTION

This invention relates generally to printed circuit tecnology.

BACKGROUND OF THE INVENTION

A design printed on a film of material for subsequent transfer onto a surface of a second material is known in the art as a decalcomania (decal). Each decal is fabricated using materials such as certain plastics or specially prepared paper. These materials typically serve as the underlying film (decal film) on which the design is desired to be printed onto. Upon completion of the fabrication process, the decal (now a combination of the design and the decal film)is applied onto the surface of a second material by various methods, such as thermally heating the decal to bond it to the surface of the second material.

Also known in the art is the fabrication of an electrically conductive pattern on a non-conductive material (substrate). This fabrication technique is commonly known as printed circuit technology. The final product of such a process may be a printed circuit board or a printed circuit strip. Typically, copper is used as the material for the conductive pattern, while the substrate material is some type of plastic laminate (such as FR-4 plastic). The substrate provides a physical backing onto which the conductive layer is plated as a layer. (The substrate also provides some electrical properties that are not relevant to this application and will not be discussed.) Plating of the conductive layer onto the substrate is generally done by a process known as chemical electroplating.

Molded devices plated with a conductive circuit pattern are also known in the art. These molded devices are typically formed using certain plastics. Unlike printed circuit boards or films (which are substantially planar), molded devices can be single-sided three dimensional or double-sided three dimensional in structure. Using a similar process as that used above for printed circuit technology, the conductive pattern is plated onto the surfaces of the molded device.

These technologies suffer a number of limitations. For instance, the performance of printed circuits is impaired or degraded when the material forming the conductive pattern is unintentionally scratched or removed, as for example, by abrasive forces. This unintended removal of the conductive pattern is further compounded by a weak bond between the conductive layer and the substrate. Another limitation of the above technologies is the cost involved in chemically plating the conductive layer onto the substrate. The plating process requires a significant amount of space (for the many tanks of chemicals required) and time (hours of soaking the printed circuit films or boards in the chemical baths before plating is completed).

Therefore, a need exists for a method to substantially overcome the limitations stated above. In particular, a plating process that ensures a stronger bond between the conductive pattern and the substrate is highly desired. In addition, the plating process should reduce the requirements of space, time, and materials, in order to provide a more economical alternative to the existing process.

BRIEF DESCRIPTION OF THE DRAWINGS

FIG. 1 shows a side elevational, sectioned view of a decal film substrate;

FIG. 2 shows a side elevational, sectioned view of the decal film substrate having a conductive material sprayed thereon;

FIG. 3 shows a side elevational, sectioned view of the decal film substrate having the conductive material plated thereon and photomasked with a pattern;

DESCRIPTION OF A PREFERRED EMBODIMENT

Figure 5:
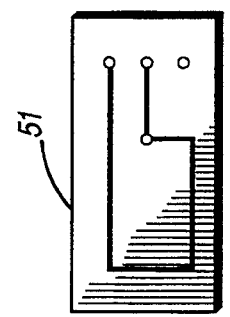
FIG. 5 shows a top plan view of a decal with a conductive pattern.

In accordance with a preferred embodiment of the present invention, a first step is to fabricate a decal with a conductive pattern plated thereon. The fabrication of this decal begins with selecting a sheet of material to serve as a decal film substrate (10), as shown in FIG. 1. This decal film substrate (10) is typically made from a non-conductive material such as polycarbonate, polyester, or acrylonitrile butadiene styrene (ABS). Other possible materials include any from the following group of materials: polyimides, polyetherimide, or polyesterimide.

Following the selection of the decal film substrate (10), FIG. 2 shows the decal film substrate (10) plated with a first metallic conductive layer (21), such as copper. A second metallic conductive layer (such as tin) (not shown) may be applied over the first metallic conductive layer (21), depending on the requirements of the first metallic conductive layer (21). Such a second metallic conductive layer would serve to prevent oxidation of the first metallic conductive layer (21), and would also increase the solderability of the areas in which it is applied over the first metallic conductive layer (21).

In accordance with the present invention, one method of plating the first metallic conductive layer (21) is to use a thermal spray gun. METCO, a thermal spray gun manufacturer, has a variety of such thermal spray guns and publishes product literature that also includes information on thermal spraying methods to apply a coating of a conductive material (22) onto a substrate material, such as the decal film substrate (10). Typically, as shown in FIG. 2, the decal film substrate (10)is positioned such that the thermal spray gun's nozzle (23) is perpendicular to the surface of the decal film substrate (10) and at a distance of between 25 centimeters to 50 centimeters (as recommended by METCO for general usage).

Thermal spraying requires the desired metallic conductive material (22) to be first melted from a powder form into a molten liquid. Thickness variations of the sprayed metallic conductive layer (21) is controlled by factors such as the thermal spray method or the type of material(s) used in the spraying. This method of thermally spraying a conductive material (22) is well known in the art and references include U.S. Pat. No. 4,424,408 entitled HIGH TEMPERATURE CIRCUIT BOARD and U.S. Pat. No. 4,532,152 entitled FABRICATION OF A PRINTED CIRCUIT BOARD WITH METAL-FILLED CHANNELS, both patents assigned to Elarde.

Thermal spraying of a material layer is known to have significant advantages over other forms of plating a substrate. METCO outlines one improvement in the bonding strength between the sprayed material layer and the underlying substrate when compared to the equivalent material and substrate bonded by other known methods such as electrochemical plating. Another improvement is the reduced wastage of the sprayed material, as most of the unused sprayed material is easily recoverable. To those skilled in the art, recovery of the unused materials in thermal spray systems can result in utilizing, overall, more than 99% of the available material (as opposed to a typical 25% waste in conventional electrochemical plating).

Figure 4:
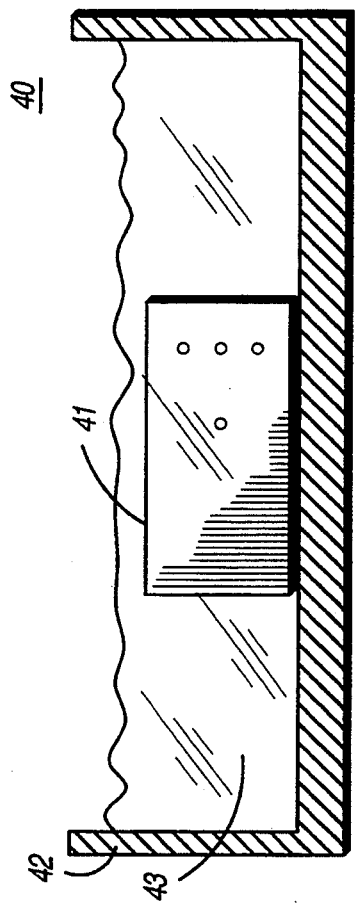
FIG. 4 shows a sectioned view of the decal film substrate, photomasked with a conductive pattern and immersed in a tank containing an etching chemical.

The next step in the decal fabrication process is to remove selected portions of the first metallic conductive layer (21) (and the second metallic conductive layer if present) to form a metallic conductive pattern. This removal of the unwanted areas in the metallic conductive layer (21) is also well known in the art as etching and is typically a two step process. The first step is photo-masking (30) the conductive pattern onto the metallic conductive layer (21) as shown in FIG. 3. Photo-masking (30) requires the metallic conductive layer (21) to be photochemically treated by ultra-violet light (31) emanating from an ultra-violet light source (32). The ultra violet light (31) passes through a pattern template (33) that images the pattern onto the metallic conductive layer (21). The result of photo-masking (30) is a photomasked decal film (41), shown in FIG. 4. The second step in the etching process, known as chemical etching (40), chemically removes the areas that are photochemically treated in the photo-masking (30) process. In chemical etching (40), the photo-masked decal film (41) is immersed in a tank (42) containing an etching chemical (43).

When chemical etching (40) is completed, FIG. 5 shows the decal (51) that now has a conductive pattern plated thereon. In accordance with the present invention, the next step is to affix the decal (51) to a surface of a component, such as a communication unit housing.

The decal (51), now complete with a conductive pattern plated thereon, may next be applied onto a component (not shown) in the following method. In accordance with the present invention, the decal (51) is first placed in close proximity to the component. With the decal (51) so positioned, heat and pressure is then applied to the decal (51) to bond the decal (51) onto the component. (Besides heat and pressure, an alternative embodiment of bonding the decal (51) onto a component includes using an adhesive paste.) The end product is a device comprising the component with a conductive pattern on one of the component's surfaces.

Figure 6:
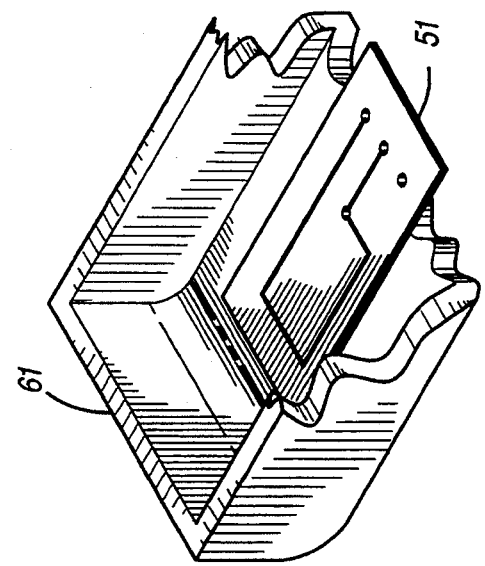
FIG. 6 shows a perspective detail view of the decal with the conductive pattern placed in a mold.

An alternative embodiment of the present invention is to place the decal (51) in a mold (61) (FIG. 6) from which the component is to be molded. The location of the decal (51) within the mold (61) depends on where the conductive pattern is required. This further depends on the layout of the overall device as predetermined by a designer.

Figure 7:
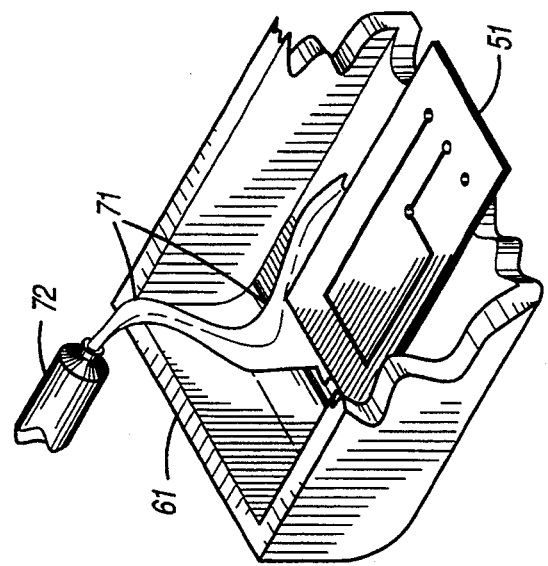
FIG. 7 shows a perspective detail view of a resin material injected into the mold having the decal with the conductive pattern placed therein.
Figure 8:
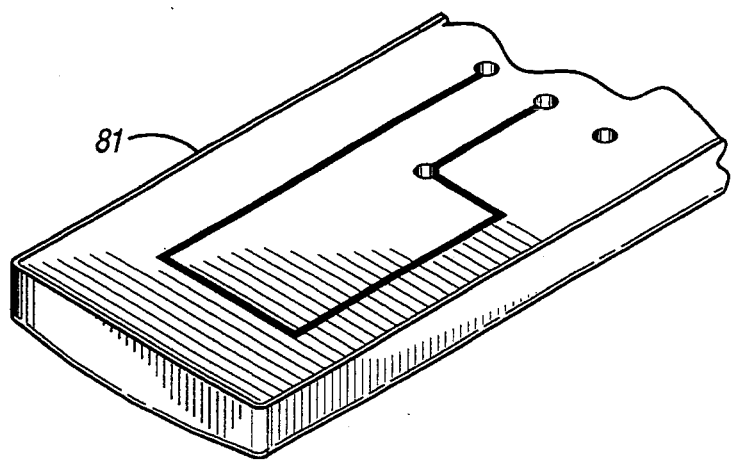
FIG. 8 shows a perspective detail view of a molded device with a decal affixed thereon.

After placing the decal (51) within the mold (61), FIG. 7 shows a liquid resin (71) being injected into the mold (61) from a resin holder (72). The resin (71) is the raw material that eventually gets processed into plastics such as ABS, polycarbonate, or polyester. The mold (61), at this point containing the resin (71) and the decal (51), is then specially treated to cure the resin (71) within in accordance with well understood prior art techniques. This process of curing also bonds the decal (51) to the component thus molded. Special treatment to cure the resin (71) typically requires placing the mold (61) in a temperature-regulated environment for a period of time, or adding some chemical substance to solidify the liquid resin (71). The end result of the curing is a molded component (81) comprising a conductive pattern affixed to one of the molded component's (81) surfaces, as shown in FIG. 8.

Figure 9:
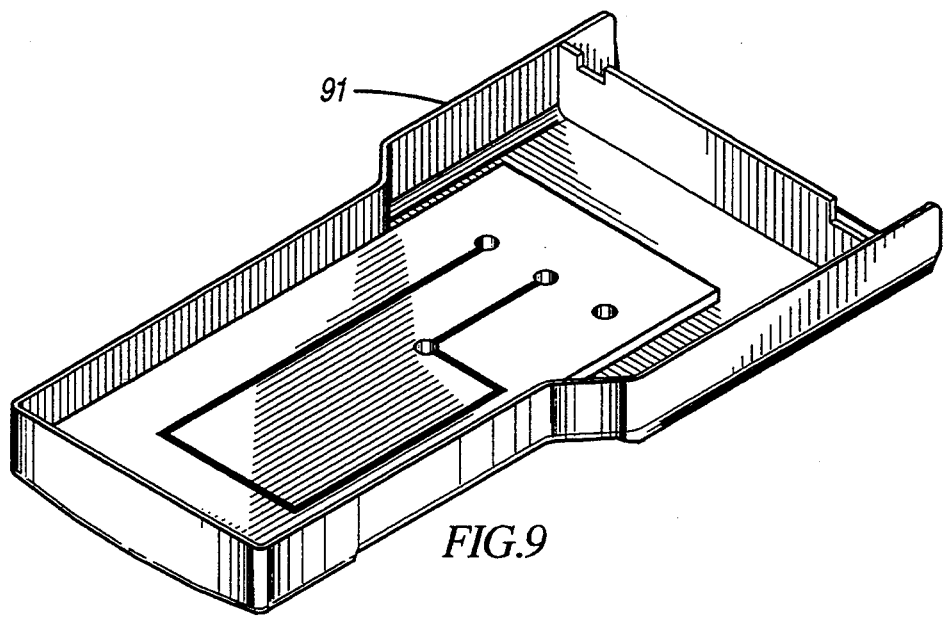
FIG. 9 shows a top plan perspective view of an alternative embodiment of a mold for a communication unit with a conductive pattern plated thereon.

In accordance with the present invention, the device can be a communication unit housing (91), as illustrated in FIG. 9 with the decal attached thereto. This housing (91) can be fabricated using either the decal (51) with a pre-fabricated housing, or by the method outlined above wherein the mold (61) of the housing (91) is used.

This method of plating a device with a conductive pattern saves a considerable amount of time by eliminating the process of electrochemically plating the metallic conductive layer (21) onto the component (81). In addition, thermally spraying a conductive material layer results in a stronger bond between the conductive material (22) and the decal film substrate (10).

Compared to the prior art, the novel approach of using the decal (51) with a conductive pattern allows the flexibility of placing the decal (51) in different places on the component (81), and also within the mold (61) that is used to make the component (81). Another novelty is that more variations in conductive material patterning is possible for the same device because the fabrication of the decal (51) is a separate process. Flexibility and variations are necessary in the manufacture of electronic devices (particularly for communication devices) where the products require many, as well as different, features to cater to changing demands and differing needs.

What is claimed is:

1. A method of forming a decal having conductive paths thereon, comprising the steps of:
   A) providing a non-conductive decal film;
   B) placing a conductive pattern on the non-conductive decal film.

2. The method of claim 1, wherein the step of placing the conductive pattern on the non-conductive decal film includes the step of thermal spraying a first metallic conductive material on the non-conductive decal film.

3. The method of claim 2, wherein the step of thermal spraying a first metallic conductive material on the non-conductive decal film further includes the step of thermal spraying a second metallic conductive material on the first metallic conductive material.

4. The method of claim 3 wherein the first metallic conductive material comprises copper.

5. The method of claim 4 wherein the second metallic conductive material comprises tin.

6. The method of claim 1, wherein the step of placing the conductive pattern on the non-conductive decal film includes the step of printing a metallic conductive material on the non-conductive decal film.

7. The method of claim 1, wherein the step of placing the conductive pattern on the non-conductive decal film includes the steps of:
B1) placing a metallic conductive material on the non-conductive decal film; and
B2) removing selective portions of the metallic conductive material to form a pattern of metallic conductive material on the non-conductive decal film.

8. The method of claim 1 wherein the step of providing the non-conductive decal film includes the step of providing a film comprised of polycarbonate material.

9. The method of claim 1 wherein the, step of providing the non-conductive decal film includes the step of providing a film comprised of polyester material.

10. The method of claim 1 wherein the step of providing the non-conductive decal film includes the step of providing a film comprised of acrylonitrile butadiene styrene material.

11. The method of claim 1 wherein the step of providing the nonconductive decal film includes the step of providing a film composed of a material selected from the group consisting of:
polycarbonate;
polyester;
acrylonitrile butadiene styrene;
polyimide;
polyetherimide; and
polyesterimide.

12. A method of forming a device having a conductive pattern thereon, comprising the steps of:
A) providing a non-conductive decal film;
B) placing a conductive pattern on the non-conductive decal film to form a decal having a conductive pattern formed thereon;
C) providing at least one other component;
D) combining the decal having the conductive pattern formed thereon with the at least one other component to form the device.

13. The method of claim 12, wherein the step of combining the decal having the conductive pattern formed thereon with the at least one other component includes the steps of:
D1) placing the decal having the conductive pattern formed thereon in close proximity to the at least one other component;
D2) applying heat and pressure to the decal having the conductive pattern formed thereon to cause the decal having the conductive pattern formed thereon to bond to the at least one other component.

14. The method of claim 12, wherein the step of combining the decal having the conductive pattern formed thereon with the at least one other component includes the steps of:

D1) placing the decal having the conductive pattern formed thereon in a component mold;
D2) injecting resin into the component mold.

15. The method of claim 14, wherein the step of combining the decal having the conductive pattern formed thereon with the at least one other component further includes the steps of:
D3) curing the resin.

16. The method of claim 12, wherein the step of placing the conductive pattern on the non-conductive decal film includes the step of thermal spraying a first metallic conductive material on the non-conductive decal film.

17. The method of claim 16, wherein the step of thermal spraying a first metallic conductive material on the non-conductive decal film further includes the step of thermal spraying a second metallic conductive material on the first metallic conductive material.

18. The method of claim 17 wherein the first metallic conductive material comprises copper.

19. The method of claim 18 wherein the second metallic conductive material comprises tin.

20. The method of claim 12, wherein the step of placing the conductive pattern on the non-conductive decal film includes the step of printing a metallic conductive material on the non-conductive decal film.

21. The method of claim 12, wherein the step of placing the conductive pattern on the non-conductive decal film includes the steps of:
B1) placing a metallic conductive material on the non-conductive decal film; and
B2) removing selective portions of the metallic conductive material to form a pattern of metallic conductive material on the non-conductive decal film.

22. The method of claim 12 wherein the step of providing the non-conductive decal film includes the step of providing a film comprised of polycarbonate material.

23. The method of claim 12 wherein the step of providing the non-conductive decal film includes the step of providing a film comprised of polyester material.

24. The method of claim 12 wherein the step of providing the non-conductive decal film includes the step of providing a film comprised of acrylonitrile butadiene styrene material.

25. The method of claim 12 wherein the step of providing the nonconductive decal film includes the step of providing a film composed of a material selected from the group consisting of:
polycarbonate;
polyester;
acrylonitrile butadiene styrene;
polyimide;
polyetherimide; and
polyesterimide.

* * * * *